(12) United States Patent
Martinelli et al.

(10) Patent No.: US 7,154,803 B2
(45) Date of Patent: Dec. 26, 2006

(54) REDUNDANCY SCHEME FOR A MEMORY INTEGRATED CIRCUIT

(75) Inventors: Andrea Martinelli, Gazzaniga (IT); Daniele Balluchi, Cernisco Sul Naviglio (IT); Corrado Villa, Sovico (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 66 days.

(21) Appl. No.: 10/893,760

(22) Filed: Jul. 16, 2004

(65) Prior Publication Data

US 2005/0047226 A1    Mar. 3, 2005

(30) Foreign Application Priority Data

Jul. 16, 2003   (EP) ................... 03077228

(51) Int. Cl.
*G11C 8/00* (2006.01)
(52) U.S. Cl. ............... 365/227; 365/226; 365/229; 365/200
(58) Field of Classification Search .......... 365/227, 365/226, 229, 200
See application file for complete search history.

(56) References Cited

U.S. PATENT DOCUMENTS

| 5,262,993 | A |   | 11/1993 | Horiguchi et al. ........... 365/200 |
| 5,428,621 | A |   | 6/1995 | Mehrotra et al. ........... 371/21.4 |
| 5,659,550 | A | * | 8/1997 | Mehrotra et al. ........... 714/721 |
| 5,768,196 | A | * | 6/1998 | Bloker et al. ............... 365/200 |
| 5,822,256 | A | * | 10/1998 | Bauer et al. ............... 365/200 |
| 6,058,052 | A | * | 5/2000 | Steadman ................... 365/200 |
| 6,075,729 | A | * | 6/2000 | Ohhata et al. .............. 365/190 |
| 6,078,540 | A | * | 6/2000 | Keeth ....................... 365/226 |
| 6,141,267 | A | * | 10/2000 | Kirihata et al. ............. 365/200 |
| 6,233,181 | B1 | * | 5/2001 | Hidaka ...................... 365/200 |
| 6,313,695 | B1 | * | 11/2001 | Ooishi et al. ............... 327/544 |
| 6,535,437 | B1 | * | 3/2003 | Silver et al. ................ 365/200 |
| 6,865,133 | B1 | * | 3/2005 | Tsukidate et al. ......... 365/230.01 |
| 6,873,555 | B1 | * | 3/2005 | Hiraki et al. ............... 365/194 |
| 6,947,329 | B1 | * | 9/2005 | Campardo et al. ....... 365/185.26 |

FOREIGN PATENT DOCUMENTS

| EP | 0 626 645 A2 | 11/1994 |
| WO | WO 90/12401 | 10/1990 |

* cited by examiner

*Primary Examiner*—Viet Q. Nguyen
(74) *Attorney, Agent, or Firm*—Lisa K. Jorgenson; David V. Carlson; Seed IP Law Group PLLC

(57) ABSTRACT

A redundancy scheme for a memory integrated circuit having at least two memory sectors and, associated with each memory sector, a respective memory location selector for selecting memory locations within the memory sector according to an address. The redundancy scheme comprises at least one redundant memory sector adapted to functionally replace one of the at least two memory sectors, and a redundancy control circuitry for causing the functional replacement of a memory sector declared to be unusable by one of the at least one redundant memory sector; the redundancy control circuitry detects an access request to a memory location within the unusable memory sector and diverts the access request to a corresponding redundant memory location in the redundant memory sector. Associated with each memory location selector, respective power supply control means are provided adapted to selectively connect/disconnect the associated memory location selector to/from a power supply distribution line. A memory sector unusable status indicator element is associated with each memory sector, for controlling the respective power supply control means so as to cause, when set, the selective disconnection of the respective memory location selector from the power supply distribution line.

18 Claims, 4 Drawing Sheets

REDUNDANCY SCHEME FOR A MEMORY INTEGRATED CIRCUIT

BACKGROUND OF THE INVENTION

1. Field of the Invention

The present invention relates in general to memory integrated circuits, particularly but not limitatively to non-volatile memories; more specifically, the invention concerns the implementation of redundancy in memory integrated circuits.

2. Description of the Related Art

An important aspect in the design of Integrated Circuits (ICs) is a careful implementation of redundancy. Generally speaking, implementing redundancy in ICs means duplicating those circuit blocks that are considered more critical for the IC functionality; the duplicated (in jargon, redundant) circuit blocks can thus be exploited for functionally replacing the corresponding main circuit blocks in the event of failures thereof.

Implementing redundancy is of paramount importance in memory ICs, and particularly in high-capacity memories having very large and extremely dense arrays of memory cells.

Especially when a new manufacturing technology is being developed, it is in fact highly probable that manufacturing defects impair the functionality of some of the memory cells in the array. If no precautions were taken in the design phase, the presence of these defects would have a substantial impact on the overall yield of the manufacturing process.

For these reasons, redundancy is widely used in memory ICs.

Redundancy can be implemented in memory ICs in several ways. For example, redundant rows or columns of memory cells can be provided in the memory cell array, for functionally replacing defective rows or columns, e.g., rows or columns containing defective memory cells.

In particular, in Flash memory ICs having memory cell arrays made up of two or more individually alterable memory blocks or sectors (i.e., elemental portions of the memory cell array that can be individually erased in bulk without however altering the content of other portions of the memory array), redundancy is commonly implemented by providing one or more memory sector duplicates, referred to as redundant memory sectors. In this way, a defective memory sector can be functionally replaced by one of the available redundant memory sectors.

A redundancy control circuitry is conventionally provided, capable of storing address codes identifying defective memory sectors which have been functionally replaced by redundant memory sectors; each time a new address code is received by the memory, the redundancy control circuitry compares the received address code to the stored address code, so as to establish whether the memory location identified by the received address code belongs to one of the defective memory sectors. If the addressed memory location does not belong to a defective memory sector, the memory location is normally accessed; on the contrary, if the addressed memory location belongs to a defective memory sector, the normal address decoding and selection circuits that allow selecting the addressed memory location within the memory sector are disabled, and a redundant memory location is instead selected within the redundant memory sector that functionally replaces the defective sector.

In this way, the defective memory sector is kept isolated from any operation of read or alteration of the memory content.

However, the Applicant has observed that this conventional way of implementing sector redundancy in a Flash memory has some drawbacks, which will be discussed hereinbelow.

First of all, when a memory sector is identified as defective, the conventional implementation of redundancy does not really allow completely isolating the defective sector from the normal operation of the memory. For example, the local row address decoder and word line selection circuitry (shortly, the row decoder) associated with the defective memory sector is not actually isolated from the remaining of the IC, being instead still kept powered by the prescribed voltages necessary for reading the memory locations or altering the content thereof, notwithstanding the fact that the associated memory sector is defective and has been functionally replaced by a redundant memory sector. In fact, it is not feasible to delay the act of powering the row decoder so as to condition this act to the outcome of the comparison, performed by the redundancy control circuitry, of the current address code received by the memory to the stored defective address codes: the relatively heavy capacitive loads involved would in fact slow down the reaching of the prescribed voltages, and this would have a negative impact on the access time to the memory. Possible defects within the row decoder may thus cause current leakages that may cause the overall current consumption of the memory IC to exceed specified ratings; even worse, the leakages could be so high that the voltage generators (charge pumps) internal to the memory IC and that generate the voltages used for powering the row decoders are not capable of sustaining them: the output voltages of these generators may thus fall to levels that are too low for ensuring satisfactory performances of the memory.

Another drawback inherent to the conventional implementation of the sector redundancy in Flash memories is the lengthening of the memory access time; the address decoding circuitry of the memory is in fact inevitably affected by the delay inherent to the comparison that needs to be each time performed by redundancy control circuitry between the current address code and the stored address codes of the defective memory sectors.

Normally, when a new address code is received, the address decoding circuitry starts decoding the received address and selecting the corresponding memory location in the addressed memory sector, irrespective of the fact that the memory sector is defective. When the redundancy control circuitry has established that the addressed memory location belongs to a defective memory sector, a corresponding memory location in the redundant memory sector is selected in substitution of the initially selected location; however, before being able to, e.g., read the redundant memory location, it is necessary to wait for the deselection of the initially selected location. This causes a lengthening of the access time.

Additionally, there is the risk that, during the transients caused by random accesses to the memory, one or more word lines of a defective memory sector (possibly, defective word lines that are short-circuited to ground) are accidentally selected.

In order to avoid that a defective memory sector is accidentally selected during the memory location selection transient, the memory access time has to take into account the time necessary to compare the current address code to the stored defective sector address codes. This comparison causes a non-negligible delay, particularly in the selection of the memory sectors located far from the address decoding circuitry; this is for example evident when leaving a redundant memory sector.

BRIEF SUMMARY OF THE INVENTION

It is one object of the present invention to improve the efficiency of the conventional implementation of redundancy.

According to the present invention, this and other objects have been attained by means of a redundancy scheme as set forth in appended claim 1.

Summarizing, the redundancy scheme comprises a redundancy control circuitry for causing the functional replacement of unusable memory sector by one of the redundant memory sectors, by detecting an access request to a memory location within the unusable memory sector and diverting the access request to a corresponding redundant memory location in the redundant memory sector. In addition, the redundancy scheme comprises power supply control means, associated with each one of the memory location selectors that are associated with the memory sectors for selecting memory locations thereof, adapted to selectively connect/disconnect the associated memory location selector to/from a power supply distribution line.

An unusable status indicator element is also provided associated with each memory sector, for controlling the respective power supply control means so as to cause, when set, the selective disconnection of the respective memory location selector from the power supply distribution line.

BRIEF DESCRIPTION OF THE SEVERAL VIEWS OF THE DRAWINGS

The features and advantages of the present invention will be made apparent by the following detailed description of an embodiment thereof, provided merely by way of non-limitative example, which will be conducted making reference to the annexed drawings, wherein.

DETAILED DESCRIPTION OF THE INVENTION

Figure 1:
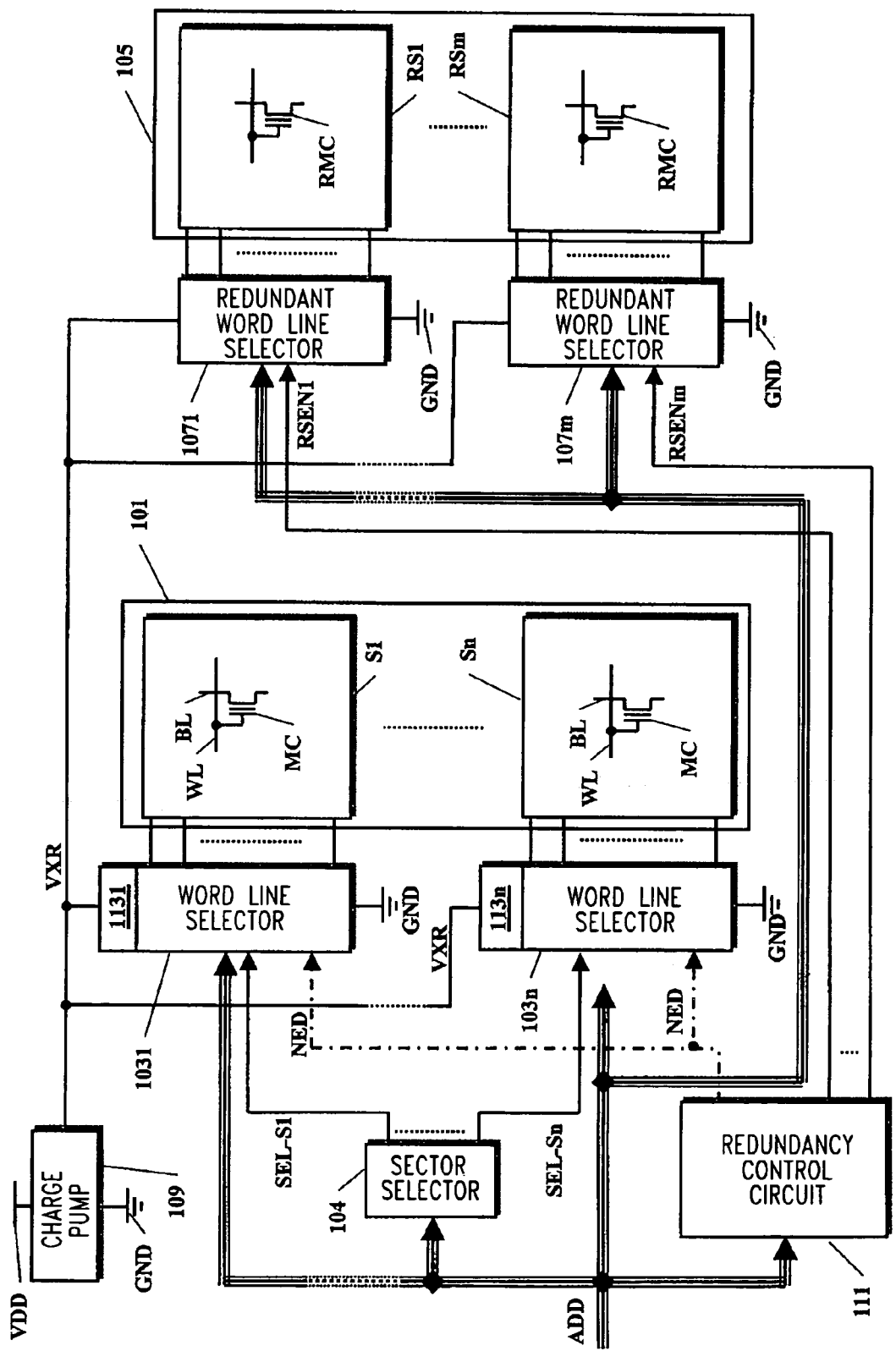
FIG. 1 schematically shows the relevant functional blocks of a memory IC according to the invention, particularly a memory arranged in a plurality of memory sectors.

With reference to the drawings, in FIG. 1 the functional blocks of a memory IC relevant for the purpose of describing an exemplary embodiment of the present invention are shown.

One embodiment of the invention will be hereinafter described as it relates to a non-volatile memory IC, particularly an electrically erasable and programmable memory and, even more particularly, a Flash memory. However, this is not to be construed as a limitation of the present invention, which can be in general applied to any kind of memory and, particularly, to any memory organized by memory blocks.

The memory IC includes a bidimensional arrangement or matrix 101 of electrically programmable and electrically erasable memory cells MC, particularly, in the exemplary embodiment herein considered, MOS transistors having a drain electrode, a source electrode, a floating gate electrode and a control gate electrode.

Flash memories are programmable selectively by bytes or words, but are erasable only in bulk. A known measure to provide a certain degree of erase selectivity in Flash memories calls for partitioning the memory matrix 101 in two or more memory portions or memory sectors S1–Sn. For example, the different memory sectors S1–Sn can contain a same number of memory cells MC (e.g., 512 K memory cells each, for a total of 512 Kbits); more typically, Flash memory ICs have memory sectors of different sizes, intended for different functions (e.g., a relatively small memory sector of a few KBytes to be used as a microprogram boot block, and bigger memory sectors for mass storage of data).

Each memory sector S1–Sn forms the elemental memory unit or block that can be erased individually, without altering the content of the other memory sectors.

Within each memory sector S1–Sn, the memory cells MC are conventionally arranged by rows and columns, with associated word lines and bit lines, respectively. Considering a generic memory cell MC in a generic memory sector S1–Sn, the memory cell control gate is connected to one word line WL of the memory sector, the drain is connected to one bit line BL of the memory sector, the source is in common with the sources of the other memory cells of the memory sector and it is connected to a source common line (not shown) common for the memory sector.

Each memory sector S1–Sn has associated therewith a respective word line selector $103_1$–$103_n$, for the selection of the memory sector word lines. The generic word line selector $103_1$–$103_n$ receives address codes through an address code distribution bus ADD of the memory IC, and decodes the address codes received.

In greater detail, the decoding of the address codes received by the memory and distributed by the address code distribution bus ADD is performed in several decoding levels; for example, a first decoding level, or memory sector address decoding level, is carried out by a memory sector selector 104, receiving and decoding a first portion, or sector address code, of the address codes ADD; depending on the specific sector address code received, the memory sector selector 104 asserts one of a plurality of memory sector selection signals SEL-S1–SEL-Sn, each one fed to a respective word line selector $103_1$–$103_n$. The assertion of one of the memory sector selection signals SEL-S1–SEL-Sn enables the respective word line selector $103_1$–$103_n$, while the remaining word line selectors are kept disabled. A second portion of the address code, or row address, is decoded by the enabled word line selector $103_1$–$103_n$ in one or, more typically, two or more stages, for selecting a specific word line in the selected memory sector. The remaining portion of the address codes, or column address, is received and decoded by bit line selector circuits, not shown in the drawings for the sake of simplicity, for selecting the memory sector bit lines.

In FIG. 1, each word line selector $103_1$–$103_n$ is depicted as receiving a respective supply voltage from a supply voltage distribution line VXR of the memory IC, through which variable levels of voltage are distributed, corresponding to the different operations to be carried out on the memory cells; typically, through the supply voltage distribution line VXR a read voltage of about 5 V for the read operation and a write voltage of up to 12 V for the write operation are distributed; a negative voltage of, e.g., −9 V can also be supplied to the word line selectors 1031–103*n* for the erase operation of the memory sectors. In this way, the word line selector 1031–103*n* associated with the selected memory sector S1–Sn can bring the selected word line to the proper voltage. The different voltages for the different operations can be fed to the memory IC from the outside or, as in the current trend, generated internally to the memory IC by means of charge-pump voltage generator arrangements, depicted only schematically as a block 109, starting from a single voltage supply VDD as low as 3 V.

It is observed that several different bit line arrangements, and, correspondingly, different bit line selection schemes are possible. For example, a global bit line and local bit line arrangement is possible, wherein each local bit line in each memory sector is selectively connectable under the control of a local bit line selection circuitry to a corresponding global bit line, common for the whole matrix 101; a global bit line selection circuitry allows selecting one or, more typically, a group (eight or sixteen) of global bit lines, which are electrically coupled to a sensing circuitry, in the case of a read access to the memory, or to a programming circuitry, in the case of a write access. Neither the sensing circuitry, nor the programming circuitry are shown in the drawings, because these parts of the memory IC are conventional and not relevant to the present invention.

Redundancy is implemented in the memory IC of FIG. 1, for making the memory tolerant to specific classes of faults or defects.

Specifically, one or more redundant memory sectors RS1–RSm of redundant memory cells RMC are provided in the memory; for example, the redundant memory sectors RS1–RSm are formed by partitioning a matrix 105 of redundant memory cells RMC distinct from the memory cell matrix 101; alternatively, the redundant memory cells RMC can be memory cells of the memory cell matrix 101, which are provided in excess with respect to the memory cells MC, and thus the redundant memory sectors RS1–RSm can be partitions of the portion of the memory matrix 101 that contains the redundant memory cells RMC.

Each redundant memory sector RS1–RSm is substantially a duplicate of any one of the memory sectors S1–Sn, in the sense that each redundant memory sector contains a same number of memory cells, arranged by a same number of rows and columns, so as to form a same number of memory locations, as the generic memory sector S1–Sn. Thus, any one of the redundant memory sectors RS1–RSm can functionally replace, in a way substantially transparent to an external memory user, any one of the memory sectors S1–Sn. It is observed that in case the memory sectors S1–Sn have different sizes, redundant memory sectors of different sizes can be provided for.

Similarly to the memory sectors S1–Sn, each redundant memory sector RS1–RSn has associated therewith a respective redundant word line selector 1071–107*m,* for the selection of the word lines of the redundant memory sector. Similarly to the word line selectors 1031–103*n,* the generic redundant word line selector 1071–107*n* receives address codes through the address code distribution bus ADD, and decodes the address codes received. Similarly to the word line selectors 1031–103*n,* also the redundant word line selectors 1071–107*n* receive the respective supply voltage through the supply voltage distribution line VXR.

Concerning the selection of the bit lines of the redundant memory sectors RS1–RSm, similar considerations as made in the foregoing apply.

A redundancy control circuitry 111 is provided, for controlling the functional substitution of defective memory sectors S1–Sn by redundant memory sectors RS1–RSm. In particular, as shown schematically in FIG. 2, the redundancy control circuitry 111 comprises a storage area 201, with a number of storage locations 2011–201*m* equal to the number of redundant memory sectors RS1–RSm, adapted to storing address codes identifying defective memory sectors S1–Sn, and an address comparator and coincidence detector circuit arrangement 203 that compares a received address code with the defective memory sector address codes stored in the storage area 201; for example, the storage area 201 and the coincidence detector circuit 203 can be implemented by means of a Content Addressable Memory (CAM), exploiting non-volatile storage elements for non-volatily storing the defective address codes. The redundancy control circuit generates redundancy sector enable signals RSEN1–RSENm, for enabling the functional replacement of a defective memory sector by a specific redundant memory sector. Each of the redundancy sector enable signals RSEN1–RSENm is fed to, and act as an enable signal for, a respective one of the word line selectors 1071–107*m*.

When the coincidence detector circuit 203 detects coincidence between the received address code and one of the defective sector address codes stored in the storage area 201, for example the address code of the memory sector S1 assumed to be defective, one of the signals RSEN1–RSENm is asserted, and a corresponding one of the word line selectors 1071–107*m* of the redundant memory sectors RS1–RSm is enabled. Namely, the word line selector of the redundant memory sector chosen to replace the defective memory sector S1, for example the redundant memory sector RS1.

It is observed that, in addition to sector redundancy, other types of redundancy can be implemented in the memory, for example word line redundancy within each memory sector, thereby a certain number of redundant word lines are provided in each memory sector for functionally replacing defective word lines found within the memory sector.

The structure described so far substantially corresponds to the conventional implementation of sector redundancy in Flash memory ICs. In conventional sector redundancy implementations, when coincidence between the received address code and one of the stored defective sector address codes is declared, the redundancy control circuitry 111 also asserts a disable signal NED (shown in phantom in FIGS. 1 and 2), which is fed to the word line selectors 1031–103*n* for disabling all the word line selectors 1031–103*n*. In this way, the word line identified by the received address code and belonging to the defective memory sector S1 is not selected, and a corresponding word line is instead selected in the redundant memory sector RS1 chosen to replace the defective memory sector S1.

The conventional sector redundancy scheme has the drawbacks already discussed in the introductory part of the present description.

In order to overcome those drawbacks, according to an embodiment of the present invention, for each word line selector 1031–103*n,* a word line selector power supply control circuit is further provided. The word line selector power supply control circuits are shown only schematically in FIG. 1, and are identified therein as 1131–113*n;* in FIG. 2, the structure of a generic word line selector power supply control circuit, e.g., the circuit 1131, is shown in greater detail, referring to an exemplary embodiment of the present invention. The word line selector power supply control circuit 1131 comprises a power supply switch 207 adapted to switch a supply voltage input 209 of the respective word line selector 1031 between the supply voltage line VXR and the reference voltage or ground GND. In an exemplary and non-limitative embodiment of the present invention, the power supply switch 207 comprises a pair of complementary MOSFETs M1, M2 connected in series to each other, with a P-channel MOSFET M1 connected between the supply voltage line VXR and a switch output line VXS, and an N-channel MOSFET M2 connected between the switch output line VXS and the ground GND; the switch output line VXS is connected to the supply voltage input 209 of the word line selector 1031. Other switch structures are clearly possible, for example comprising only N-channel or only P-channel MOSFETs, or other types of transistors.

The power supply switch 207 is controlled by a memory sector defectiveness indicator or flag element 211, comprising a storage element, particularly a volatile storage element such as a flip-flop or a bistable latch, which can be set to a prescribed logic state so as to indicate a status of defectiveness of the corresponding memory sector S1 and/or of the word line selector 1031; depending on the state of the flag element 211, the switch 207 connects the supply voltage input 209 of the word line selector 1031 either to the supply voltage line VXR, or to the ground GND: in the former case, the word line selector 1031 is properly powered, while in the latter case the selector 1031 is disconnected from the supply voltage line VXR. In particular, assuming that the flag element 211 is a flip-flop, a data output 213 thereof can be exploited to directly drive the power supply switch 207 by connecting the flip-flop data output to the gates of the MOSFETs M1, M2 or, as in the shown embodiment, the flip-flop data output 213 can be fed to a logic gate 215, e.g. an OR gate, together with an external forcing signal VXS-OFF, which can be asserted to forcedly disconnect the word line selector 1031 from the voltage supply line VXR, irrespective of the fact that the memory sector S1 and/or the word line selector 1031 have been ascertained to be defective. In particular, in the exemplary and non-limitative embodiment shown in FIG. 2, a "1" logic state on either the flip-flop data output 213 or the forcing signal VXS-OFF causes the switch 207 to disconnect the word line selector supply voltage input 209 from the supply voltage line VXR, and to connect the supply voltage input 209 to the ground. If desired, a disable signal WLS-DIS can also be derived from the flip-flop data output 213 and be fed to the word line selector 1031 so as to disable the word line selector 1031 when the flip-flop 211 is set; the action of the disable signal WLS-DIS is similar to that of the disable signal NED conventionally generated by the redundancy control circuit 111. The disable signal NED can thus be dispensed for, and be replaced by the disable signal WLS-DIS generated locally to each word line selector 1031–103n.

In other words, the powering of each word line selector depends on the status of a respective defectiveness indicator, and is not dependent on the comparison between a received address code and the stored defective sector address codes.

Figure 3:
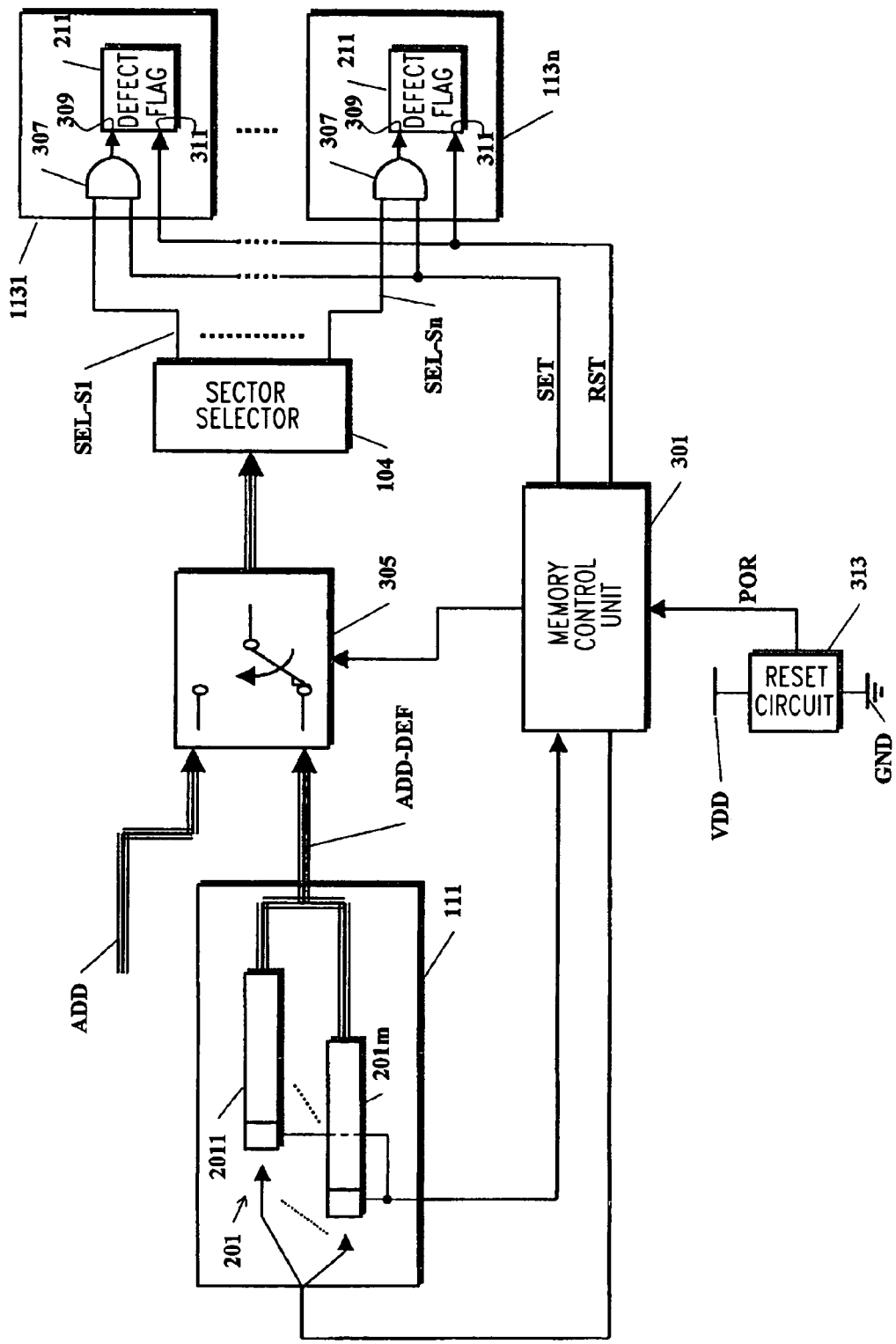
FIG. 3 schematically shows an arrangement for properly configuring the different word line selector control elements associated with the different memory sectors.

Referring now to FIG. 3, a circuit arrangement for setting the flip-flops 211 of the word line selector power supply control circuits 1131–113n is schematically shown. During a flip-flop configuration phase, a memory control unit, schematized as a block 301, accesses the redundancy control circuitry 111, particularly the storage locations 2011–201m in the storage area 201, for retrieving all the defective memory sector address codes stored in the storage area 201. Typically, defective memory sector address codes are stored in the storage area during a memory IC post-manufacturing testing phase. For example, the defective memory sector address codes stored in the storage area 201 are extracted in sequence, and made available on a defective address code distribution bus ADD-DEF. Through the defective address code distribution bus ADD-DEF, the defective address codes are fed to the memory sector selector 104 that, in the normal operation of the memory, receives memory sector address codes through the address code distribution bus ADD; to this purpose, a switch arrangement 305, controlled by the memory control unit 301, allows connecting the memory sector selector 104 to the defective address code distribution bus ADD-DEF, instead than to the address code distribution bus ADD, during the phase of setting of the flip-flops 211. Depending on the defective memory sector address code received, the memory sector selector 104 asserts one of the sector selection signals SEL-S1–SEL-Sn. Each sector selection signals SEL-S1–SEL-Sn is used for enabling the setting of a respective flip-flop 211; in particular, referring to the shown exemplary embodiment, each sector selection signal SEL-S1–SEL-Sn is fed to a logic gate 307, particularly an AND gate, together with a flip-flop set signal SET generated by the memory control unit 301 and common to all the word line selector power supply control circuits 1131–113n. Within each power supply control circuit 1131–113n, an output of the AND gate is fed to a set input 309 of the respective flip-flop 211.

In the storage area 201, each location 2011–201m adapted to storing a defective memory sector address code has associated therewith an indicator that the storage location actually stores a defective sector address code; this indicator is read and used by the memory control unit 301 for deciding whether or not to assert the flip-flop set signal SET, as described in greater detail in the following.

A common flip-flop reset or clear signal RST, generated by the memory control unit 301, is instead fed to a reset input 311 of all the flip-flops 211.

It can be appreciated that in this way the memory sector address decoding scheme already provided in the memory for decoding memory sector address codes and for selecting corresponding memory sectors S1–Sn is expediently exploited for properly configuring the flip-flops 211 in the word line selector power supply control circuits 1131–113n associated with the different memory sectors.

The phase of configuration of the power supply control circuits 1131–113n can for example take place at each power-up of the memory IC; to this purpose, a power-on reset signal POR, generated by a conventional power-on reset circuit 313 capable of detecting the presence of the supply voltage VDD, is exploited by the memory control unit 301 for triggering the operation of configuration of the flip-flops 211.

Figure 4:
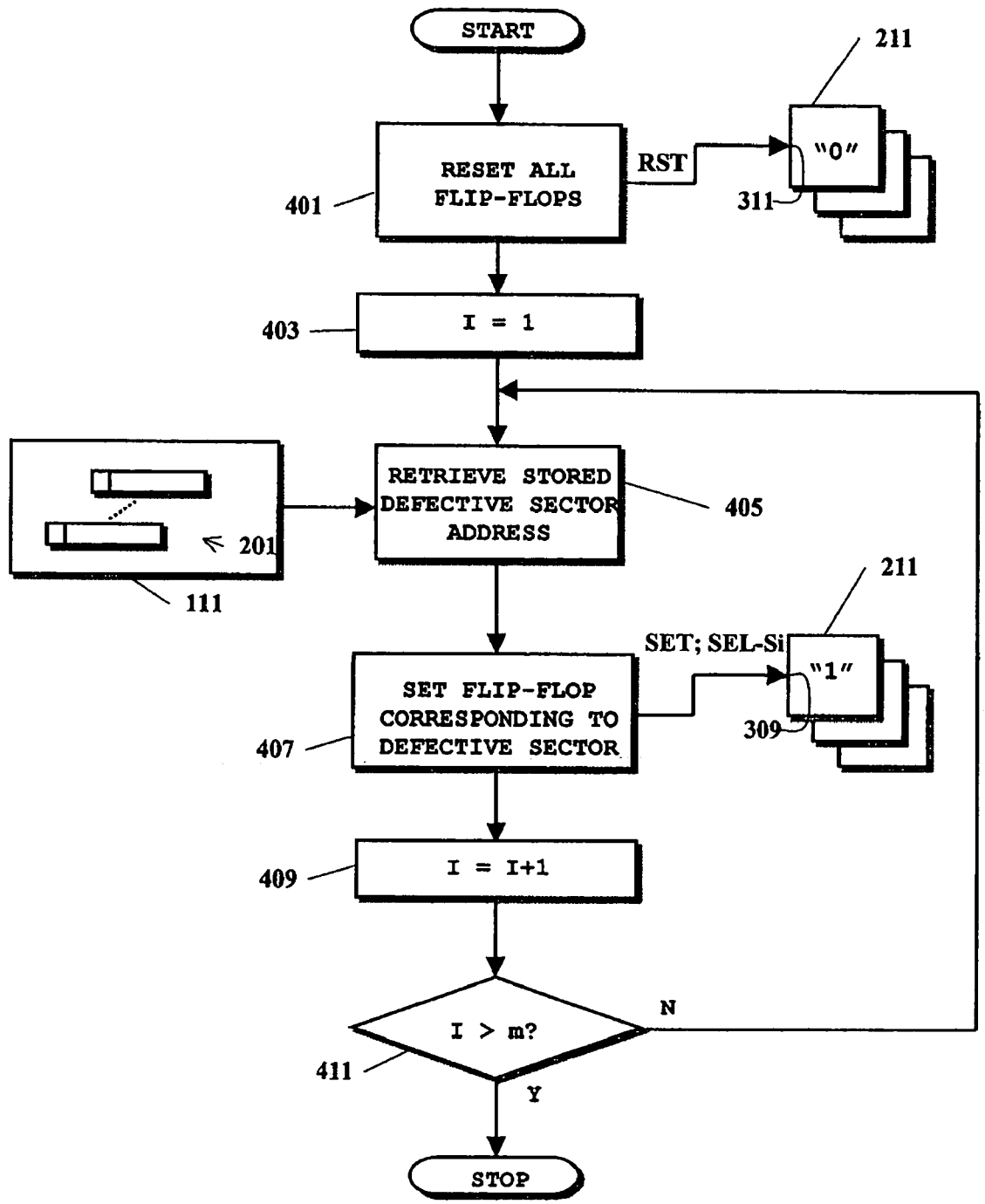
FIG. 4 is a simplified flowchart illustrating an operation of configuration of the control elements.

FIG. 4 is a schematic and greatly simplified flowchart illustrating the operation of configuration of the flip-flops 211 in the power supply control circuits 1131–113n, in an embodiment of the present invention. As mentioned in the foregoing, the configuration operation is triggered by the assertion of the power-on reset signal POR, which is detected by the memory control unit 301. Firstly, the memory control unit 301 resets all the flip-flops 211 (block 401); to this purpose, the memory control unit 301 asserts the reset signal RST that commonly fees the flip-flop reset inputs 311. Then, after having set to an initial value (e.g., 1) an iteration index I (block 403), a loop is entered in which, at each iteration, one of the storage locations 2011–201m of the storage area 201 is accessed and the defective memory sector address code stored therein is retrieved therefrom (block 405). The retrieved memory sector address code is fed to the memory sector selector 104, and the corresponding sector selection signal SEL-Si (i=1, . . . , n) is thus asserted. If the memory control unit 301 establishes that the indicator associated with the current storage location 201 1–201m is set, the memory control unit 301 asserts the set signal SET, so as to set the prescribed flip-flop 211 corresponding to the memory sector whose address code has been retrieved from the storage area 201 (block 407); otherwise, the set signal SET is not asserted and the flip-flop 211 is not set. At each iteration, the index I is incremented by one (block 409). The loop is exited when all the storage locations 201 1–201m in the storage area 201 have been inspected (block 411).

Figure 2:
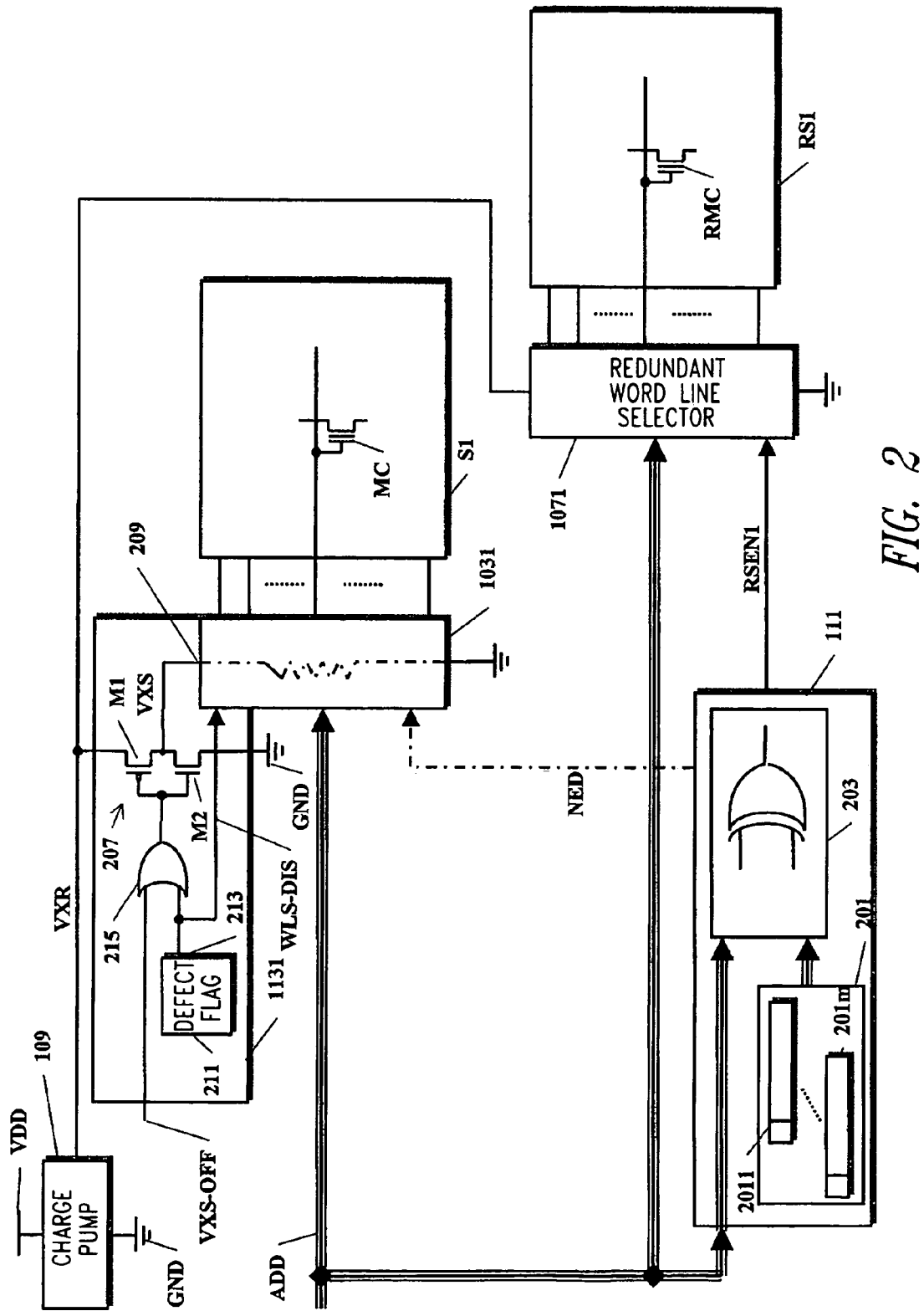
FIG. 2 schematically shows a memory sector redundancy scheme according to an embodiment of the present invention, comprising control elements for individually disconnecting word line selectors of the memory sectors from a power supply.

In operation, once the flip-flops 211 have been properly configured, the word line selectors 103a–103n associated with the defective memory sectors are always kept disconnected from the supply voltage line VXR in one embodiment; in this way, possible defects in the word line selectors 103a–103n, such as a short-circuit between the supply voltage input 209 and the ground GND, schematically depicted in FIG. 2 do not introduce leakages on the output of the charge-pump voltage generators 109. In an alternative embodiment there are other ways to isolate the defective memory sectors to ensure they do not consume power and these techniques are acceptable use with the present invention.

When the address code received by the memory IC corresponds to a defective memory sector, the redundancy control circuit 111 detects the coincidence between the received address code and the defective sector address code store in the storage area 201; one of the redundant memory sector selection signals RSEN1–RSENm is asserted, and the redundant memory sector RS1–RSm chosen to functionally replace the defective memory sector is accessed instead of the defective memory sector.

It is observed that thanks to the above described arrangement, it is avoided that possible defects at the level of the word line selectors 1031–103n cause an unacceptable increase in the power consumption ratings of the memory IC or, even worse, cause the charge-pump voltage generators that generates the necessary internal voltages are excessively loaded.

Thanks to the above described redundancy scheme, the risk that, during the transients caused by random accesses to the memory, one or more word lines of a defective memory sector are accidentally selected is avoided.

Additionally, the present invention allows reducing the access time to the memory. In fact, thanks to the fact that the word line selectors associated with memory sectors that have been functionally replaced by redundant memory sectors are kept unpowered (responsive to the configuration of the respective defectiveness indicators, which are set once and for all at the memory IC power up, and do not require a run-time comparison of address codes), the present invention eliminates the waste of time that conventionally takes place in waiting the deselection of the memory location in the defective memory sector after address code coincidence is detected.

The above described redundancy scheme allows reducing the memory access time, because it is no more necessary to take into account the time necessary for comparing the received address code to the stored address codes. In fact, the provision of the power supply disconnection under the control of the local flip-flop prevents any undesired accidental selection of a defective memory sector, and the comparison between the received address code and the stored address codes can be carried out in parallel, without the necessity of stopping the normal address decoding circuitry. Additionally, considering that the redundancy memory sectors are normally placed close to the memory logic circuitry, particularly the redundancy control circuitry and the address decoding circuitry, the time required for performing the above-mentioned address comparison can be compensated for by a lower time of propagation of the redundancy sector selection signals.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Although described making reference to a Flash memory, the present invention can be applied in general to any kind of memory, either volatile or non-volatile, and particularly to any kind of memory organized by memory blocks.

The present invention has been herein disclosed and described by way of an embodiment; it is apparent to those skilled in the art that several modifications to the described embodiment, as well as other embodiments of the present invention are possible without departing from the scope thereof as defined in the appended claims.

The invention claimed is:

1. A redundancy scheme for a memory integrated circuit having at least two memory sectors and, associated with each memory sector, a respective memory location selector for selecting memory locations within the memory sector according to an address, the redundancy scheme comprising:
   at least one redundant memory sector adapted to functionally replace one of the at least two memory sectors;
   a redundancy control circuitry for causing the functional replacement of a memory sector declared to be unusable by one of the at least one redundant memory sector, said redundancy control circuitry detecting an access request to a memory location within the unusable memory sector and diverting the access request to a corresponding redundant memory location in the redundant memory sector,
   associated with each memory location selector, respective power supply control means adapted to selectively connect/disconnect the associated memory location selector to/from a power supply distribution line, said power supply control means comprise a switch, responsive to the respective memory sector unusable status indicator element, for switching a supply voltage input (209) of the associated memory location selector between a supply voltage distribution line (VXR) and a reference voltage distribution line, and
   a memory sector unusable status indicator element associated with each memory sector, for controlling the respective power supply control means so as to cause, when set, a selective disconnection of the respective memory location selector from the power supply distribution line.

2. The redundancy scheme according to claim 1, in which each of said unusable status indicator elements comprises a volatile storage element, particularly a flip-flop or a bistable latch.

3. The redundancy scheme according to claim 1, further comprising configuration means for configuring the memory sector unusable status indicator elements according to an unusable memory sector information stored in the redundancy control circuitry.

4. The redundancy scheme according to claim 3, in which said configuration means are adapted to configure the memory sector unusable status indicator elements in correspondence of a power-up of the memory integrated circuit.

5. The redundancy scheme according to claim 3, in which said configuration means comprise a sector selector, for generating sector selection signals in response to sector addresses, and means for causing the sector selector to receive unusable sector addresses stored in the redundancy control circuitry.

6. The redundancy scheme according to claim 1, in which said memory location selector is a word line selector for selecting word lines of the respective memory sector.

7. A memory integrated circuit comprising a redundancy scheme according to claim 1.

8. The memory integrated circuit according to claim 7, in which the memory is an electrically erasable and programmable memory erasable by blocks, and wherein each of said memory sectors is the elemental, individually-erasable memory block.

9. A redundancy scheme for a memory integrated circuit having a plurality of memory sectors and, associated with each memory sector, a respective memory location selector for selecting memory locations within the memory sector according to an address, the redundancy scheme comprising:
 a redundant memory sector adapted to functionally replace one of the plurality of memory sectors;
 a redundancy control circuitry adapted to cause the functional replacement of a memory sector declared to be unusable with a redundant memory sector, said redundancy control circuitry detecting an access request to a memory location within the unusable memory sector and diverting the access request to a corresponding redundant memory location in the redundant memory sector;
 associated with each memory location selector, respective power supply control adapted to selectively connect/disconnect the associated memory location selector to/from a power supply distribution line, said power supply control including a switching circuit adapted to switch a supply voltage input of the associated memory location selector between a supply voltage distribution line and a reference voltage distribution line; and
 a memory sector unusable status indicator element associated with each memory sector and outputting a signal to permit selective disconnection of the respective memory location selector from the power supply distribution line.

10. The redundancy scheme of claim 9 in which said switching a supply voltage input means includes a pair of complementary MOSFETs connected in series to each other, with a P-channel MOSFET connected between the supply voltage distribution line and a switch output line VXS, and an N-channel MOSFET connected between the switch output line VXS and the reference voltage distribution line.

11. The redundancy scheme of claim 10 in which said switch output line VXS is further connected to the supply voltage input of the memory location selector.

12. A memory integrated circuit comprising a redundancy scheme according to claim 9.

13. A redundancy scheme for a memory integrated circuit having at least two memory sectors and, associated with each memory sector, a respective memory location selector for selecting memory locations within the memory sector according to an address, the redundancy scheme comprising:
 at least one redundant memory sector adapted to functionally replace one of the at least two memory sectors;
 a redundancy control circuitry for causing the functional replacement of a memory sector declared to be unusable by one of the at least one redundant memory sector, said redundancy control circuitry detecting an access request to a memory location within the unusable memory sector and diverting the access request to a corresponding redundant memory location in the redundant memory sector;
 associated with each memory location selector, respective power supply control means adapted to selectively connect/disconnect the associated memory location selector to/from a power supply distribution line; and
 a flip-flop or a bistable latch associated with each memory sector, which, when set, provides selective disconnection of the respective memory location selector from the power supply distribution line.

14. A memory integrated circuit comprising a redundancy scheme according to claim 13.

15. A redundancy scheme for a memory integrated circuit having at least two memory sectors and, associated with each memory sector, a respective memory location selector for selecting memory locations within the memory sector according to an address, the redundancy scheme comprising:
 at least one redundant memory sector adapted to functionally replace one of the at least two memory sectors;
 a redundancy control circuitry for causing the functional replacement of a memory sector declared to be unusable by one of the at least one redundant memory sector, said redundancy control circuitry detecting an access request to a memory location within the unusable memory sector and diverting the access request to a corresponding redundant memory location in the redundant memory sector;
 associated with each memory location selector, respective power supply control means adapted to selectively connect/disconnect the associated memory location selector to/from a power supply distribution line;
 a memory sector unusable status indicator element associated with each memory sector, for controlling the respective power supply control means so as to cause, when set, a selective disconnection of the respective memory location selector from the power supply distribution line;
 configuration means for configuring the memory sector unusable status indicator elements;
 means for generating sector selection signals; and
 means for causing a sector selector to receive unusable sector addresses stored in the redundancy control circuitry.

16. The redundancy scheme of claim 15 in which said redundancy control circuitry further comprises a storage area with a number of storage locations equal to the number of redundant memory sectors.

17. A method for replacing an unusable sector having a supply voltage input and reducing power consumption of a memory array comprising:
 sensing that a first sector of a plurality of sectors in a memory array is unusable;
 replacing the unusable sector with a redundant memory sector; and
 switching the supply voltage input for the unusable sector from a positive supply voltage distribution line to a reference voltage distribution line to terminate connection of the supply voltage input to a positive power supply after replacing the first sector with the redundant sector.

18. The method according to claim 17 wherein the reference voltage distribution line is ground voltage potential.

* * * * *